United States Patent
Yamashiro et al.

(10) Patent No.: US 9,543,928 B2
(45) Date of Patent: Jan. 10, 2017

(54) GATE DRIVING CIRCUIT AND METHOD FOR DRIVING SEMICONDUCTOR DEVICE

(75) Inventors: Keisuke Yamashiro, Yokosuka (JP); Hiromu Takubo, Mitaka (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 226 days.

(21) Appl. No.: 12/189,319

(22) Filed: Aug. 11, 2008

(65) Prior Publication Data
US 2009/0058499 A1 Mar. 5, 2009

(30) Foreign Application Priority Data

Aug. 27, 2007 (JP) ................................. 2007-219244

(51) Int. Cl.
*H03K 3/012* (2006.01)
*H03K 17/16* (2006.01)

(52) U.S. Cl.
CPC ............ *H03K 3/012* (2013.01); *H03K 17/168* (2013.01)

(58) Field of Classification Search
CPC ....... H03K 3/012; H03K 17/168; H03K 3/013
USPC ................ 327/108, 109, 374–377, 427, 434, 437,327/392–394, 399
See application file for complete search history.

(56) References Cited

U.S. PATENT DOCUMENTS

| 4,122,661 | A | * | 10/1978 | Tsuji | ................................ | 368/66 |
| 5,815,009 | A | * | 9/1998 | Iadanza et al. | .................... | 327/5 |
| 5,977,814 | A | * | 11/1999 | Ishii | .............................. | 327/434 |
| 6,271,708 | B1 | * | 8/2001 | Hoshi et al. | ................... | 327/377 |
| 6,333,665 | B1 | | 12/2001 | Ichikawa | | |
| 7,274,243 | B2 | * | 9/2007 | Pace et al. | ..................... | 327/396 |
| 7,602,229 | B2 | * | 10/2009 | Tolle et al. | ..................... | 327/440 |
| 7,786,779 | B2 | * | 8/2010 | Chang et al. | .................. | 327/170 |

FOREIGN PATENT DOCUMENTS

| JP | 10-313570 A | 11/1998 |
| JP | 11-150462 A | 6/1999 |

(Continued)

OTHER PUBLICATIONS

Igarashi et al.; "Low-Loss and Low-Noise IPM "L-Series" Mounting New di/dt Control Functions"; vol. 77, No. 9 (2003), pp. 567-570; partial translation provided.

(Continued)

*Primary Examiner* — Lincoln Donovan
*Assistant Examiner* — Colleen O Toole
(74) *Attorney, Agent, or Firm* — Rossi, Kimms & McDowell LLP

(57) ABSTRACT

A gate driving circuit and method can improve the tradeoff relation between the noise and the loss caused in the turn-OFF switching of semiconductor device. The gate driving circuit includes first and second series circuits. The first series circuit includes first and second MOSFETs connected in series. The gate terminal of the semiconductor device is connected to a negative potential side of the first MOSFET and a positive potential side of the second MOSFET. The emitter of the semiconductor device is connected to the negative potential side of the second MOSFET or a DC power source. The second series circuit includes a capacitor and a third MOSFET connected in series. The second series circuit is connected in parallel with the second MOSFET. The semiconductor device is turned OFF by turning ON the second and third MOSFETs and turning OFF the first MOSFET.

7 Claims, 3 Drawing Sheets

(56) References Cited

FOREIGN PATENT DOCUMENTS

| | | |
|---|---|---|
| JP | 2000-059189 A | 2/2000 |
| JP | 2000-253646 A | 9/2000 |
| JP | 2000-333441 A | 11/2000 |
| JP | 3666843 B2 | 4/2005 |

OTHER PUBLICATIONS

Notification of Reasons for Refusal for corresponding JP 2007-219244, mail date Oct. 2, 2012. Partial translation provided.
Notification of Reasons for Refusal for corresponding JP 2012-257649, mail date Dec. 10, 2013. Partial English translation provided.

* cited by examiner

GATE DRIVING CIRCUIT AND METHOD FOR DRIVING SEMICONDUCTOR DEVICE

BACKGROUND

As severer restrictions have been placed on the electromagnetic interference (hereinafter referred to as the "EMC"), it is vital to reduce EMF noise in various industrial fields, such as in the field of inverters. In particular, appropriate countermeasures are required to reduce the noise caused by the switching of a semiconductor device and a module mounting the semiconductor device thereon, which are main components of the equipments used in the above-described industrial fields. The countermeasures taken against a noise generating loop include an additional provision of components, such as capacitors, ferrite cores, and various filters formed by combining the capacitors and the ferrite cores. The countermeasures taken against the EMC noise include narrowing the area of the noise generating loop. Thus, various countermeasures need to be taken depending on the use and the states of the pertinent equipments.

The EMC noise also can be reduced by improving the switching waveform (noise source). For example, an intelligent power module (hereinafter referred to as an "IPM") that includes an insulated gate bipolar transistor (hereinafter referred to as an "IGBT") incorporating a gate diving circuit, prevents the gate diving circuit from generating the noise. Since the IPM described above itself can reduce the noise without employing any component added externally, the above-described IPM is very effective to adding a high value thereto. Due to the desirability described above, the countermeasure as described in Mitubishi Denki Gihou, Vol. 77, No. 9 (2003), pp. 567-570 (hereafter Mitubishi publication) has been adapted for an IPM.

The IPM disclosed in the Mitubishi publication has a gate driving circuit that can select one or two current sources for driving an IGBT, depending on the collector current of the IGBT. The current-source-selection function makes the IGBT gate voltage rise slowly in a low-current region, where the turn-OFF dv/dt of a freewheel diode (hereinafter referred to as a "FWD") is large, to realize soft switching. The IPMs that mount a driving circuit intended to reduce noise have been already put into commercial use.

Japanese Patent No. 3666843, which corresponds to U.S. Pat. No. 6,333,665, discloses a countermeasure employed in a gate driving circuit for reducing the turn-OFF loss in the semiconductor device. The countermeasure includes a capacitor connected in parallel to a resistor in the driving circuit. For the period immediately after the turn-OFF switching and until the completion of charging the capacitor, the capacitance between the gate and the emitter of the pertinent semiconductor device is discharged via the capacitor at a time constant faster than the time constant at which the capacitance between the gate and the emitter is discharged only via the gate resistance. By the scheme described above, the Miller period at the turn-OFF of the semiconductor device can be shortened to reduce the loss.

The countermeasure taken in the IPM driving circuit described in the Mitubishi publication is useful for reducing the turn-OFF noise. However, the gate resistance is set high in the low current range, where the voltage changing rate dv/dt, at which the voltage across the FWD changes at the turn-OFF, is large. Therefore, the turn-OFF noise is reduced in the low current range without taking any countermeasure against the switching loss in the tradeoff relation to the turn-OFF noise.

Since the gate resistance is changed automatically in the module, the users do not know when the current value is changed. Moreover, the users can control neither the gate resistance change nor the current value. While the inverter having the IPM described in the Mitubishi publication is operating, switching is conducted at various current values. Therefore, the gate resistance is changed automatically based on the current values in the inverter having the IPM described in the Mitubishi publication. Therefore, it is difficult to manage the dead times and the loss in the module.

For reducing the loss caused by the turn-OFF switching, the gate circuit disclosed in the Japanese Patent No. 3666843 (U.S. Pat. No. 6,333,665) disposes a capacitor in parallel with the gate resistance. By speeding up the turn-OFF, less switching loss occurs at the turn-OFF. However, if no additional countermeasure is taken, the parallel connection of the capacitor will reduce only the switching loss at the turn-OFF. The turn-OFF noise in the tradeoff relation to the switching loss will rather increase.

As described above, the switching loss and the turn-OFF noise are in a tradeoff relation with each other. For reducing both the switching loss and the turn-OFF noise and for improving the tradeoff relation, it is important to identify which part of the switching waveforms correlates strongly with the turn-OFF noise and causes the turn-OFF noise. Moreover, it is important to speed up the operation in the part of the switching waveforms that does not cause any turn-OFF noise. Therefore, the relation between the switching waveform at the turn-OFF switching and the turn-OFF noise has been investigated. FIG. 3 describes the evaluation results obtained by synchronizing a switching waveform obtained by turning OFF a DC voltage with an IGBT and a search coil waveform that is a noise index.

FIG. 3 illustrates the waveform 31 of the voltage Vce between the collector and the emitter of the IGBT, the waveform 32 of the collector current Ic, the search coil waveform 33, and the DC voltage level Vdc 34. As FIG. 3 indicates, almost no oscillation is observed on the search coil waveform 33 in the early stage of turn-OFF. At the timing "*," at which the voltage Vce 31 between the collector and the emitter reaches the DC voltage Vdc 34, the search coil waveform 33 starts oscillating suddenly.

Therefore, the change in the switching waveform after the Vce 31 reaches the Vdc 34 is important. The voltage change rate dv/dt in the range, at which the Vce is higher than the Vdc, correlates strongly to the turn-OFF noise. Conversely, the correlation between the change on the switching waveform before the timing "*" in FIG. 3 and the turn-OFF switching noise is low. Therefore, it is desirable to speed up the turn-OFF switching before the timing "*" so that the loss caused by the turn-OFF switching can be reduced. It is also desirable to conduct the turn-OFF switching as slowly as possible after the timing "*" to prevent the turn-OFF noise.

There still remains a need to improve the tradeoff relation between the noise and the losses due to the turn-OFF switching of a power semiconductor device. The present invention addresses this need.

SUMMARY OF THE INVENTION

The present invention relates to a gate driving circuit and method for driving the gate of a power semiconductor device. Specifically, the present invention relates to a gate driving circuit and a gate driving method that can reduce the noise due to turning OFF the semiconductor device and the switching losses in a tradeoff relation to the turn-OFF noise.

One aspect of the present invention is a gate driving circuit for controllably turning ON and OFF a semiconductor device (e.g., IGBT) having a gate and an emitter. The gate driving circuit includes a first series circuit having a first MOSFET and a second MOSFET connected in series with the first MOSFET, and a second series circuit having a capacitor and a third MOSFET connected in series with the capacitor. The first series circuit is connectable to a positive side and a negative side of a DC power supply. The second series circuit is connected in parallel with the second MOSFET. The gate of the semiconductor device is connected to a negative potential side of the first MOSFET and a positive potential side of the second MOSFET. Turning ON the second and third MOSFETs and turning OFF the first MOSFET turns OFF the semiconductor device.

The emitter of the semiconductor device can be connected to a negative potential side of the second MOSFET or the DC power supply. The third MOSFET can be turned ON simultaneously with or prior to turning ON the second MOSFET. The gate driving circuit can further include a fourth MOSFET connected in parallel with the second MOSFET. The fourth MOSFET can be turned ON as the semiconductor device is brought into an OFF state. The ON-state resistance of the second MOSFET can be higher than the ON-state resistance of the third MOSFET. The ON-state resistance of the second MOSFET can be higher than both the ON-state resistance of the third MOSFET and the ON-state resistance of the fourth MOSFET. Alternatively, the ON-state resistance of the fourth MOSFET can be lower than both the ON-state resistance of the second MOSFET and the ON-state resistance of the third MOSFET.

Another aspect of the present invention is a method of controllably turning ON and OFF the semiconductor device, which has a gate, a collector, and an emitter. The method includes feeding at least a positive voltage to the gate of the semiconductor device for controllably turning ON and OFF the semiconductor device, setting a changing rate of a voltage between the collector and the emitter of the semiconductor device to be large until the voltage between the collector and the emitter of the semiconductor device reaches a DC voltage applied between the collector and the emitter of the semiconductor device to turn OFF the semiconductor device, and setting the changing rate of the voltage between the collector and the emitter of the semiconductor device to be small after the voltage between the collector and the emitter of the semiconductor device reaches the DC voltage applied between the collector and the emitter of the semiconductor device.

DETAILED DESCRIPTION

Figure 1:
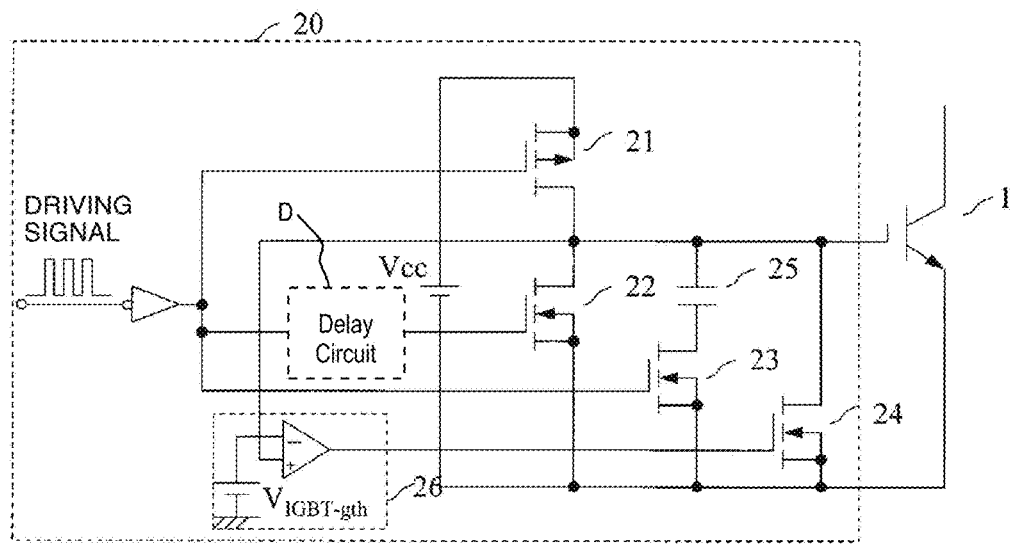
FIG. 1 is a circuit diagram showing a first embodiment of a gate driving circuit according to the present invention.

FIG. 1 illustrates a first embodiment of a gate driving circuit 20 for driving a semiconductor device 1, which can be IGBT. The gate driving circuit 20 includes a first semiconductor device 21, which can be a p-channel MOSFET (hereinafter referred to as "first MOSFET"), a second semiconductor device 22, which can be an n-channel MOSFET (hereinafter referred to as "second MOSFET"), a third semiconductor device 23, which can be an n-channel MOSFET (hereinafter referred to as "third MOSFET"), a fourth semiconductor device 24, which can be an n-channel MOSFET (hereinafter referred to as "fourth MOSFET"), a capacitor 25 connected series with the third MOSFET 23, and a control circuit 26 that controls the fourth MOSFET 24. The control circuit 26 is configured to keep the IGBT 1 turned OFF. A DC power supply Vcc applies a gate voltage to the gate terminal of the IGBT 1. Specifically, the DC power supply Vcc is connected to both ends of the (first) series circuit composed of the first and second MOSFETs 21, 22.

The negative potential side (i.e., drain terminal) of the first MOSFET 21 and the positive potential side (i.e., drain terminal) of the second MOSFET 22 are connected to the gate terminal of the IGBT 1. The negative potential side (i.e., source terminals) of second through fourth MOSFETs 22-24 are connected to the emitter terminal of the IGBT 1. As illustrated in FIG. 1, a driving signal is fed to the gates of first through third MOSFETs 21-23.

To turn ON the IGBT 1, only the first MOSFET 21 is turned ON to apply the voltage of the DC power supply Vcc to the gate terminal of IGBT 1. To turn OFF the IGBT 1, the first MOSFET 21 is turned OFF and the second and third MOSFETs 22 and 23 are turned ON. The turn-ON operation thus is the same as that according to the prior art. But extracting the electric charges stored between the gate and the emitter of the IGBT 1 quickly with the capacitor 25 in the early stage of the turn-OFF speeds up the turn-OFF operation to reduce the turn-OFF loss. During when the noise caused by the IGBT 1 conducting the turn-OFF operation thereof affects badly, the second MOSFET 22 extracts the electric charges stored between the gate and the emitter of the IGBT 1, setting the ON-state resistance thereof to be high, to slowdown the turn-OFF operation and reduce the turn-OFF noise.

In other words, it is effective to flow the electric charges stored between the gate and the emitter of the IGBT 1 to the capacitor 25 in the early stage of turning OFF the IGBT 1. In practice, it is effective to turn ON the third MOSFET 23 earlier than the second MOSFET 22. For turning ON the third MOSFET 23 earlier than the second MOSFET 22, a delay circuit D (see FIG. 1) that delays the driving signal fed to the second MOSFET 22 can be connected to the gate of the second MOSFET 22. Alternatively, the gate resistance of the second MOSFET 22 can be set high to lengthen the turn-ON period. It is also effective to set the ON-state resistance of the second MOSFET 22 higher than the ON-state resistance of the third MOSFET 23. For setting the ON-state resistance of the second MOSFET 22 higher than the ON-state resistance of the third MOSFET 23, the channel length in the second MOSFET 22 is set longer than the channel length in the third MOSFET 23. The turn-ON timing and the ON-state resistance value of the second and third MOSFETs 22 and 23 can be adjusted by changing the device areas thereof or by setting the device patterns finer. For preventing the turn-OFF noise and turn-OFF loss, the ON-state resistance value of the second MOSFET 22 can be set higher than the ON-state resistance value of the third and fourth MOSFETs 23 and 24.

The third MOSFET 23 can be used as damping means for preventing the LC resonance caused by the wiring inductance L between the gate and the emitter of the IGBT 1 and the capacitance C of the capacitor 25 disposed in the circuit shown in FIG. 1. The fourth MOSFET 24 is turned ON as the IGBT 1 is brought into the OFF-state. It is effective to compare the gate voltage of the IGBT 1 with the threshold value $V_{IGBT\text{-}gth}$ thereof with the control circuit 26 to judge whether the IGBT 1 is in the OFF-state when the gate voltage of the IGBT 1 is lower than the threshold value $V_{IGBT\text{-}gth}$. Alternatively, the OFF-state of the IGBT 1 can be detected from the current between the gate and the emitter of the IGBT 1 or from the voltage between the gate and the emitter of the IGBT 1.

When the IGBT 1 having been brought into the OFF-state is detected, the fourth MOSFET 24 is turned ON. The fourth MOSFET 24 is turned ON to keep the IGBT 1 in the OFF-state and to secure a stable gate potential for the IGBT 1. For facilitating this, the ON-state resistance of the fourth MOSFET 24 can be set as low as possible. The ON-state resistance value of the fourth MOSFET 24 can be set lower than the ON-state resistance value of the second and third MOSFETs 22 and 23. Since the fourth semiconductor device 24 is disposed essentially for short-circuiting, the fourth semiconductor device 24 can be other than a MOSFET, such as a bipolar transistor. Depending on the situation, even a mechanical switch can be used in place of the fourth semiconductor device 24.

If the above-described LC resonance is suppressed well by the ON-state resistance of the third MOSFET 23, and if the potential is stable enough to prevent malfunctioning without keeping the IGBT 1 in the OFF-state, the fourth MOSFET 24 for keeping the IGBT 1 in the OFF-state can be omitted with no problem. It has been known empirically that the capacitor 25 is very effective when the capacitance thereof is equivalent to or higher than the junction capacitance between the gate and the emitter of the IGBT 1. However, certain effects are obtained even when the capacitance of the capacitor 25 is not as high as the junction capacitance between the gate and the emitter of the IGBT 1. Therefore, it is not necessary to set any numerical prescription on the capacitance of the capacitor 25.

Figure 2:
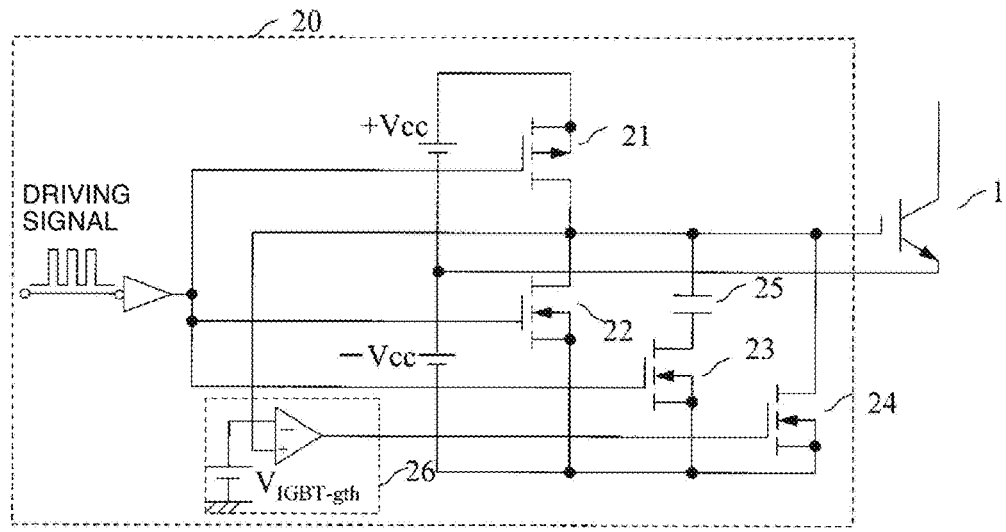
FIG. 2 is a circuit diagram showing a second embodiment of a gate driving circuit according to the present invention.
Figure 3:
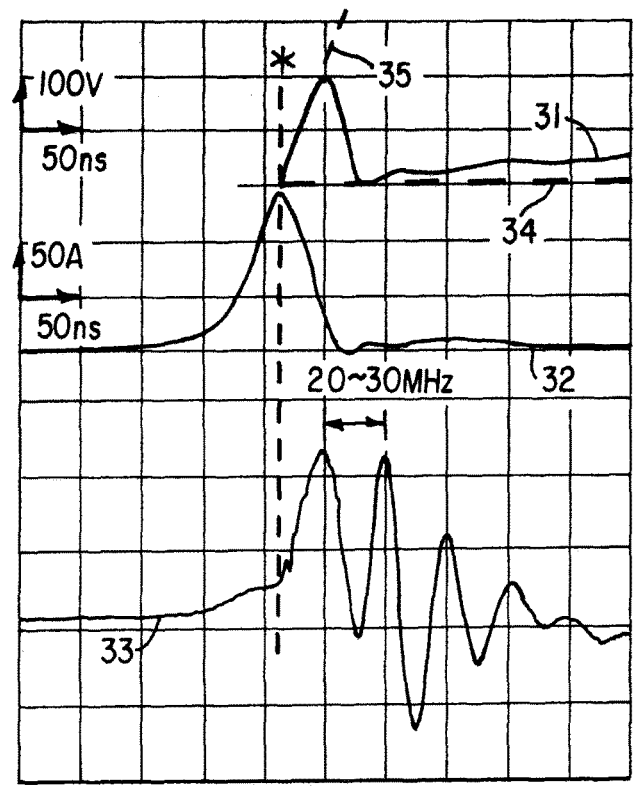
FIG. 3 is a set of waveforms describing the turn-OFF operations conducted by a conventional gate driving circuit.

In FIG. 1, the gate driving circuit need not employ any reverse bias voltage application, but connects the DC power supply Vcc to the both ends of the series circuit composed of the first MOSFET 21 and the second MOSFET 22. FIG. 2 is a circuit diagram showing a second embodiment of the gate driving circuit 20. In FIG. 2, a first DC power supply +Vcc and a second DC power supply −Vcc are disposed separately so that a positive voltage and a negative voltage, with the reference thereof being the gate potential of the IGBT 1, can be fed. Moreover, the emitter of the IGBT 1 is only connected to the DC power supply, between the first and second DC power supplies +Vcc, −Vcc, namely at the negative potential side. Since the fundamental operations of the circuits shown in FIGS. 1 and 2 are the same, the gate driving circuit 20 is applicable independently of the provision of a positive DC power supply and a negative DC power supply.

Figure 5:
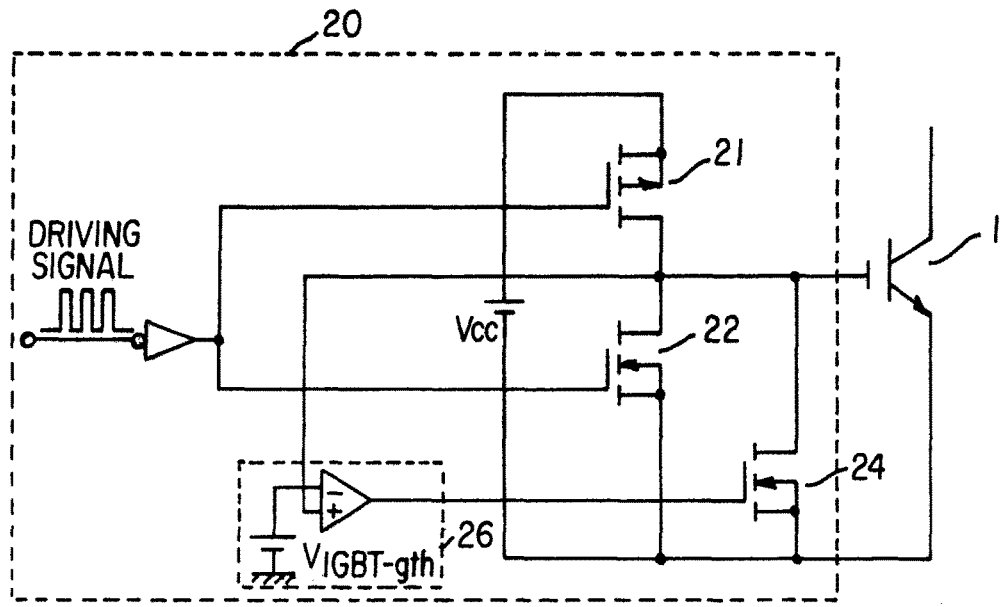
FIG. 5 is a circuit diagram showing a conventional gate driving circuit as a first comparative example.
Figure 6:
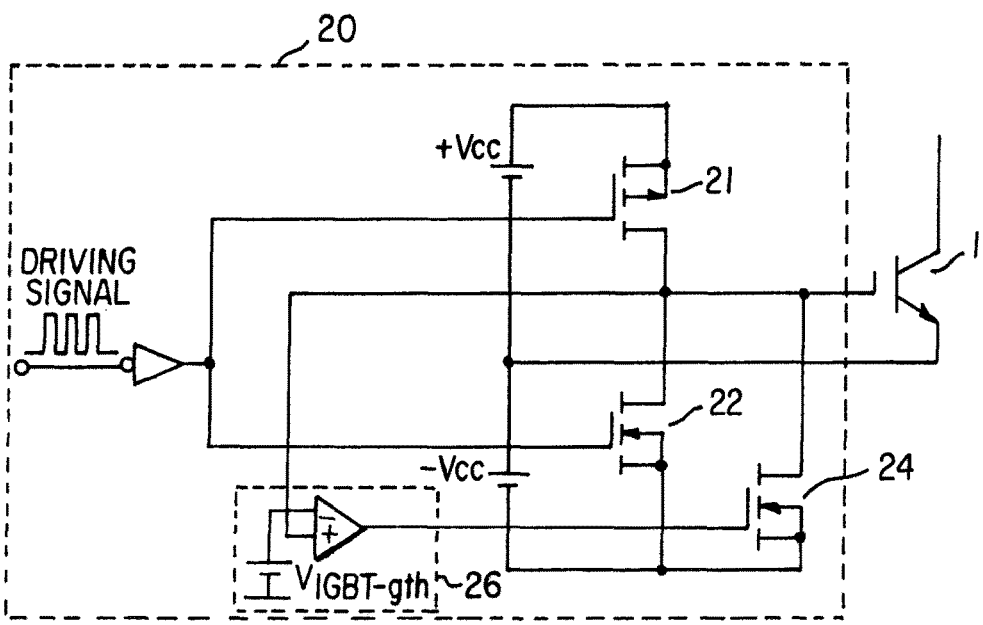
FIG. 6 is a circuit diagram showing another conventional gate driving circuit as a second comparative example.

FIGS. 5 and 6 show conventional gate driving circuits as comparative examples. The gate driving circuit shown in FIG. 5 includes a positive DC power supply, with the reference thereof being the gate potential of the IGBT 1. The gate driving circuit shown in FIG. 5 does not apply any reverse bias voltage to the gate of the IGBT 1. The gate driving circuit shown in FIG. 6 includes a positive DC power supply and a negative DC power supply, with the reference thereof being the gate potential of the IGBT 1. The gate driving circuit shown in FIG. 6 can apply a reverse bias voltage to the gate of the IGBT 1. The conventional gate driving circuit shown in FIG. 5 is similar to the gate driving circuit shown in FIG. 1 except that the conventional gate driving circuit shown in FIG. 5 does not include capacitor 25 or the third MOSFET 23. The conventional gate driving circuit shown in FIG. 6 is similar to the gate driving circuit shown in FIG. 2 except that the conventional gate driving circuit shown in FIG. 6 does not include the capacitor 25 or the third MOSFET 23.

Figure 4:
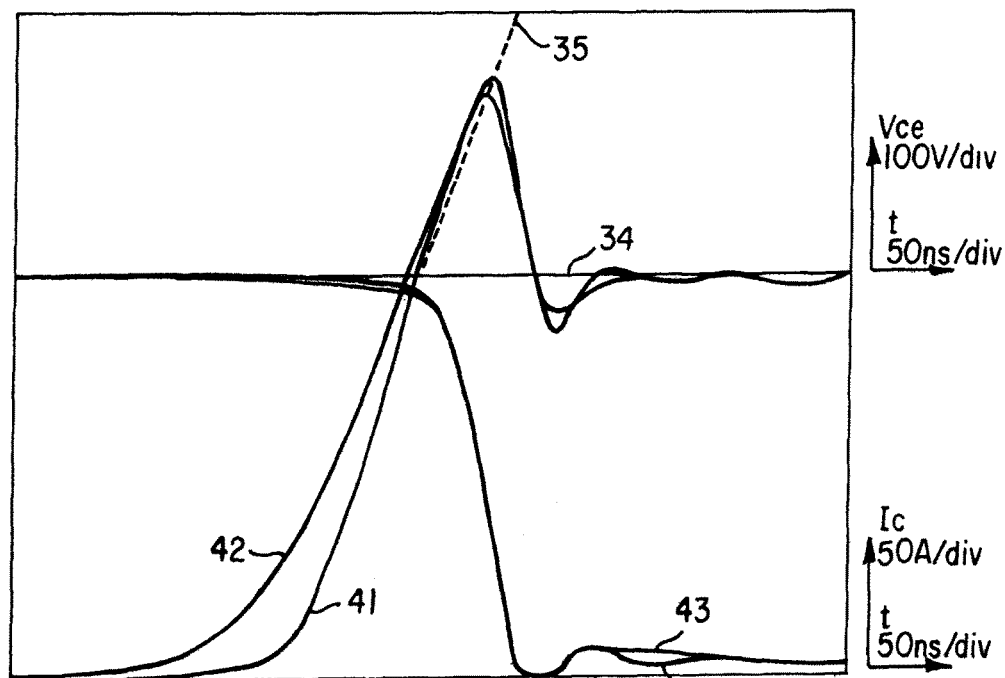
FIG. 4 is a set of waveforms describing the turn-OFF operations conducted by the gate driving circuit according to the present invention.

The observed waveforms observed in the turn-OFF switching conducted according to the second embodiment of the gate driving circuit 20 and the conventional gate driving circuit shown in FIG. 6 are illustrated in FIG. 4. In other words, the waveforms observed in the turn-OFF switching conducted by the gate driving circuits capable of applying a reverse bias voltage (−15V) are described. In FIG. 4, the Vce waveform 41 and the Ic waveform 43 observed for the second embodiment of the gate driving circuit and the Vce waveform 42 and the Ic waveform 44 observed for the comparative gate driving circuit are illustrated. When the second embodiment of the gate driving circuit is used, the turn-OFF switching is sped up as illustrated in FIG. 4 in the area before the voltage Vce reaches the DC voltage Vdc 34 in comparison with the turn-OFF switching by the comparative gate driving circuit. In other words, the change rate dv/dt of the voltage Vce is set larger in the area before the voltage Vce reaches the DC voltage Vdc in the second embodiment of the gate driving circuit than in the comparative gate driving circuit. As FIG. 4 also indicates, the change rate dv/dt of the voltage Vce in the second embodiment of the gate driving circuit is almost the same as that of the comparative gate driving circuit in the area where the Vce is higher than Vdc.

As described above, it is possible to adjust to some extents, by selecting the capacitance value of the capacitor 25 and the ON-state resistance value of the second and third MOSFETs 22 and 23, whether to mainly improve the turn-OFF noise or turn-OFF loss. The Table lists the results obtained by the measurements conducted under the circuit conditions 1 through 3. The waveforms illustrated in FIG. 4 are measured under the circuit condition 3 described in the Table.

As the results listed in the Table indicate, the tradeoff relation between the turn-OFF noise and the turn-OFF loss can be improved by employing the gate driving circuit according to the present invention. The operation principle is not different between the gate diving circuit provided with the function of applying positive and negative voltages and the gate diving circuit not provided with the function of applying a negative voltage. However, the gate diving circuit provided with the function of applying positive and negative voltages is a little bit more effective in improving the tradeoff relation between the turn-OFF noise and the turn-OFF loss.

THE TABLE

| GATE DRIVING CIRCUIT REVERSE BIAS VOLTAGE | CIRCUIT CONDITIONS | RADIATION NOISES | TURN-OFF LOSSES |
|---|---|---|---|
| Non (+15 V, −0 V) | Condition 1 | −3 dBuV/m | ±0% |
| Applied (±15 V) | Condition 2 | −6 dBuV/m | −2% |
|  | Condition 3 | −2 dBuV/m | −17% |

The gate driving circuit can be configured mainly with MOSFETs to make it easier to integrate the circuit and to reduce the circuit scale (number of constituent parts). As a modification of the gate driving circuit shown in FIG. 1, the source of the second MOSFET 22 can be connected to the connection point of the capacitor 25 and the third MOSFET 23 with no problem.

While the present invention has been particularly shown and described with reference to preferred embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on and claims priority to Japanese Patent Application 2007-219244 filed on 27 Aug. 2007. The disclosure of the priority application in its entirety, including the drawings, claims, and the specification thereof, is incorporated herein by reference.

What is claimed is:

1. A gate driving circuit for controllably turning ON and OFF a semiconductor device having a gate and an emitter, the gate driving circuit comprising:
   a first series circuit having a first MOSFET and a second MOSFET connected in series with the first MOSFET;
   a second series circuit having a capacitor and a third MOSFET connected in series with the capacitor;
   a fourth MOSFET connected in parallel with the second MOSFET,
   wherein the first series circuit configured to be connected to a positive side and a negative side of a DC power supply,
   wherein the second series circuit is connected in parallel with the second MOSFET,
   wherein the gate of the semiconductor device is connected to a negative potential side of the first MOSFET and a positive potential side of each of the second, third, and fourth MOSFETs, and the emitter of the semiconductor device is connected to a negative potential side of each of the second, third, and fourth MOSFETs,
   wherein a common ON/OFF activating signal is concurrently input to both the second and third MOSFETs to turn ON/OFF both the second and third MOSFETs,
   wherein turning OFF the first MOSFET and turning ON the second and third MOSFETs turn OFF the semiconductor device,
   wherein the fourth MOSFET is turned ON as the semiconductor device is brought into an OFF state to keep the semiconductor device in the OFF state,
   wherein the third MOSFET is always turned ON, from an OFF-state, before turning ON the second MOSFET to draw charges accumulated between the gate and the emitter of the semiconductor device into the capacitor, each time the semiconductor device is switched OFF,
   wherein at least one of the gate resistance or the ON-state resistance of the second MOSFET is higher than the corresponding gate resistance or the ON-state resistance of the third MOSFET to turn ON the third MOSFET before turning ON the second MOSFET,
   wherein the second series circuit prevents turn-OFF noise and turn-OFF loss of the semiconductor device, and
   wherein the second series circuit increases a change rate dv/dt of a voltage Vce when Vce<Vdc, Vdc being a DC voltage, while the change rate dv/dt of the voltage Vce remains substantially the same when Vce>Vdc, relative to when the gate driving circuit omits the second series circuit.

2. The gate driving circuit according to claim 1, wherein the emitter of the semiconductor device is connected to the negative potential side of the DC power supply.

3. The gate driving circuit according to claim 1, wherein the ON-state resistance of the second MOSFET is higher than the ON-state resistance of the third MOSFET to turn on the third MOSFET before turning ON the second MOSFET.

4. The gate driving circuit according to claim 1, wherein:
   the ON-state resistance of the second MOSFET is higher than the ON-state resistance of the third MOSFET to turn on the third MOSFET before turning ON the second MOSFET, and
   the ON-state resistance of the second MOSFET is also higher than the ON-state resistance of the fourth MOSFET.

5. The gate driving circuit according to claim 1, wherein the ON-state resistance of the fourth MOSFET is lower than the ON-state resistance of the second MOSFET and the ON-state resistance of the third MOSFET.

6. The gate driving circuit according to claim 3, wherein the channel length in the second MOSFET is longer than the channel length in the third MOSFET to have the ON-state resistance of the second MOSFET be higher than the ON-state resistance of the third MOSFET.

7. A gate driving circuit for controllably turning ON and OFF a semiconductor device having a gate and an emitter, the gate driving circuit comprising:
   a first series circuit having a first MOSFET and a second MOSFET connected in series with the first MOSFET;
   a second series circuit having a capacitor and a third MOSFET connected in series with the capacitor;
   a fourth MOSFET connected in parallel with the second MOSFET,
   wherein the first series circuit configured to be connected to a positive side and a negative side of a DC power supply,
   wherein the second series circuit is connected in parallel with the second MOSFET,
   wherein the gate of the semiconductor device is connected to a negative potential side of the first MOSFET and a positive potential side of each of the second, third, and fourth MOSFETs, and the emitter of the semiconductor device is connected to a negative potential side of each of the second, third, and fourth MOSFETs,
   wherein a common ON/OFF activating signal is concurrently input to both the second and third MOSFETs to turn ON/OFF both the second and third MOSFETs,
   wherein turning OFF the first MOSFET and turning ON the second and third MOSFETs turn OFF the semiconductor device,
   wherein the fourth MOSFET is turned ON as the semiconductor device is brought into an OFF state to keep the semiconductor device in the OFF state,
   wherein the second and third MOSFETs are turned ON simultaneously,
   wherein the third MOSFET is always turned ON, from an OFF-state, to draw charges accumulated between the gate and the emitter of the semiconductor device into the capacitor, each time the semiconductor device is switched off,
   wherein the second series circuit prevents turn-OFF noise and turn-OFF loss of the semiconductor device, and
   wherein the second series circuit increases a change rate dv/dt of a voltage Vce when Vce<Vdc, Vdc being a DC voltage, while the change rate dv/dt of the voltage Vce remains substantially the same when Vce>Vdc, relative to when the gate driving circuit omits the second series circuit.

\* \* \* \* \*